(12) United States Patent
Seo et al.

(10) Patent No.: US 8,859,306 B2
(45) Date of Patent: Oct. 14, 2014

(54) METHOD OF MANUFACTURING FLEXIBLE DISPLAY APPARATUS INCLUDING MULTIPLE PLASTIC FILMS

(75) Inventors: Sang-Joon Seo, Yongin (KR); Dong-Un Jin, Yongin (KR); Kie-Hyun Nam, Yongin (KR); Tae-Woong Kim, Yongin (KR); Sung-Guk An, Yongin (KR); Jae-Seob Lee, Yongin (KR); Young-Gu Kim, Yongin (KR); Hyung-Sik Kim, Yongin (KR); Young-Shin Pyo, Yongin (KR); Jung-Ha Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 806 days.

(21) Appl. No.: 12/858,322

(22) Filed: Aug. 17, 2010

(65) Prior Publication Data

US 2011/0134018 A1 Jun. 9, 2011

(30) Foreign Application Priority Data

Dec. 3, 2009 (KR) .................. 10-2009-0119095

(51) Int. Cl.
| | | |
|---|---|---|
| *H01L 21/00* | (2006.01) | |
| *H01L 51/00* | (2006.01) | |
| *H01L 27/32* | (2006.01) | |
| *H01L 51/56* | (2006.01) | |
| *G02F 1/1333* | (2006.01) | |
| *H01L 51/52* | (2006.01) | |

(52) U.S. Cl.
CPC ........... *H01L 51/003* (2013.01); *H01L 27/3244* (2013.01); *H01L 2251/5338* (2013.01); *H01L 51/56* (2013.01); *G02F 1/133305* (2013.01); *H01L 51/524* (2013.01)
USPC .............................................. 438/29; 257/40

(58) Field of Classification Search
CPC ................... H01L 51/5237; H01L 2251/5315; H01L 27/1214; H01L 2251/5338; H01L 51/5253
USPC .................................... 438/29, 28.29; 257/40
See application file for complete search history.

(56) References Cited

U.S. PATENT DOCUMENTS

| | | | | |
|---|---|---|---|---|
| 8,003,999 | B2 * | 8/2011 | Cho et al. ........................ | 257/98 |
| 2002/0187371 | A1 * | 12/2002 | Nakajima ..................... | 428/701 |

(Continued)

FOREIGN PATENT DOCUMENTS

| | | |
|---|---|---|
| KR | 10-0838073 B1 | 6/2008 |
| KR | 2009-0114195 A | 11/2009 |

OTHER PUBLICATIONS

Korean Office Action issued by the Korean Patent Office dated Feb. 1, 2011, 4 pages.

*Primary Examiner* — Duy T Nguyen
(74) *Attorney, Agent, or Firm* — Knobbe, Martens, Olson & Bear, LLP

(57) ABSTRACT

A method of manufacturing a flexible display apparatus, and more particularly, to a flexible display apparatus including a display unit including a thin-film transistor which is easily encapsulated. The method of manufacturing a flexible display apparatus includes: sequentially forming a first plastic film and a first barrier layer on a first substrate; forming a thin-film transistor on the first barrier layer; forming on the thin-film transistor a display device that is electrically connected to the thin-film transistor; forming an encapsulation member including a second substrate, a second plastic film, and a second barrier layer, wherein the second substrate and the second film are sequentially stacked on the second barrier layer; combining the encapsulation member with the upper portion of the display device; ablating the first substrate from the first plastic film; and ablating the second substrate from the second plastic film.

16 Claims, 6 Drawing Sheets

(56) References Cited

U.S. PATENT DOCUMENTS

| | | | |
|---|---|---|---|
| 2005/0006768 A1* | 1/2005 | Narasimhan et al. | 257/751 |
| 2005/0127371 A1* | 6/2005 | Yamazaki et al. | 257/72 |
| 2007/0052347 A1* | 3/2007 | Kurihara | 313/504 |
| 2007/0152212 A1 | 7/2007 | Cho et al. | |
| 2009/0266471 A1 | 10/2009 | Kim et al. | |

* cited by examiner

METHOD OF MANUFACTURING FLEXIBLE DISPLAY APPARATUS INCLUDING MULTIPLE PLASTIC FILMS

CROSS-REFERENCE TO RELATED PATENT APPLICATION

This application claims the benefit of Korean Patent Application No. 10-2009-0119095, filed on Dec. 3, 2009, in the Korean Intellectual Property Office, the disclosure of which is incorporated herein in its entirety by reference.

BACKGROUND OF THE INVENTION

1. Field of the Invention

The present embodiments relate to a method of manufacturing a flexible display apparatus, and more particularly, to a flexible display apparatus including a display unit which is easily encapsulated including a thin film transistor.

2. Description of the Related Art

Liquid crystal display devices and organic light emitting display devices which include thin film transistors (TFTs) are widely used in digital cameras, video cameras, or mobile devices such as portable personal digital assistants (PDAs) and cellular phones.

Such a display device used in mobile devices is required to be thin, light and break-resistant. A thin glass substrate may be used to prepare a thin and light display device. In addition, a display device may be prepared using a conventional glass substrate, and then the glass substrate may be thinned by a mechanical or chemical method. However, these processes are complicated and difficult to be practically used.

Thus, there is a need for a flexible display device that may be applied to a curved surface so that the mobile devices may have high portability and various shapes. However, conventional glass substrates are not flexible to accomplish this.

Thus, attempts have been made to form a low-temperature polycrystalline silicon thin-film transistor (Poly-Si TFT) on a plastic substrate. A plastic substrate having a thickness of about 0.2 mm does not easily break, and has lower specific gravity than a glass substrate. Thus, the weight of the plastic substrate may be ⅕ or less of that of the glass substrate and the plastic substrate may be applied to a curved surface.

However, when a thin plastic substrate is used, the weight of a thin-film transistor and a display device, which are formed on the thin plastic substrate, may not be supported by the thin plastic substrate while the thin-film transistor and the display device are sequentially formed on the thin plastic substrate. Thus, the process may not be controlled.

In addition, the upper portion of such a flexible display device needs to be encapsulated in order to protect the flexible display device from oxygen, moisture, etc. However, since encapsulation is usually performed on the display device as a final process for preparing the display device, the temperature used in the process is required not to be greater than 80° C. in order to prevent deterioration of the display device. Also, deterioration of the display device due to plasma during the deposition of inorganic layers needs to be prevented. The present embodiments overcome the above problems as well as provide additional advantages.

SUMMARY OF THE INVENTION

The present embodiments provide a method of manufacturing a flexible display apparatus by which an encapsulation process is easily performed.

According to an aspect of the present embodiments, there is provided a method of manufacturing a flexible display apparatus, the method including: forming a first plastic film and a first barrier layer on a first substrate; forming a thin-film transistor on the first barrier layer; forming on the thin-film transistor a display device that is electrically connected to the thin-film transistor; forming an encapsulation member including a second substrate, a second plastic film, and a second barrier layer, wherein the second film and the second substrate are sequentially stacked on the second barrier layer; combining the encapsulation member with the upper portion of the display device; ablating the first substrate from the first plastic film; and ablating the second substrate from the second plastic film.

The forming the encapsulation member may include forming the second barrier layer using high-temperature deposition at a temperature within the range of 80° C. to 400° C.

The encapsulation member may be separately prepared from the display device and combined with the display device.

The first barrier layer and second barrier layer may include an organic layer, an inorganic layer, or multiple layers of organic layers and inorganic layers that are alternately stacked.

The second barrier layer may include a photocurable material, and wherein the encapsulation member is combined with the upper portion of the display device while the photocurable material is photocured.

The second barrier layer may include a viscous material, and wherein the encapsulation member is combined with the upper portion of the display device using the viscous second barrier layer.

The ablating the first substrate from the first plastic film and ablating the second substrate from the second plastic film may be performed by irradiating laser beams to the first substrate and second substrate.

The second barrier layer may include a photocurable material that is photocured by the laser beams.

The first plastic film and second plastic film may include at least one selected from the group consisting of polyimide and polycarbonate.

The encapsulation member may further include a hydrophobic layer (to say this means that the encapsualtion member would include 4 layers, which is not the case.

The hydrophobic layer may be formed between the second plastic film and the second barrier layer.

The hydrophobic layer may be formed by wet coating.

The hydrophobic layer may include at least one selected from the group consisting of $TiO_2$, $BaO$, and $CaO$.

The display device may include an organic light emitting diode (OLED).

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

Hereinafter, the present embodiments will now be described more fully with reference to the accompanying drawings, in which exemplary embodiments are shown.

FIGS. 1 to 9 are schematic cross-sectional views for describing a method of manufacturing an organic light emitting display apparatus, according to some embodiments.

Figure 1:
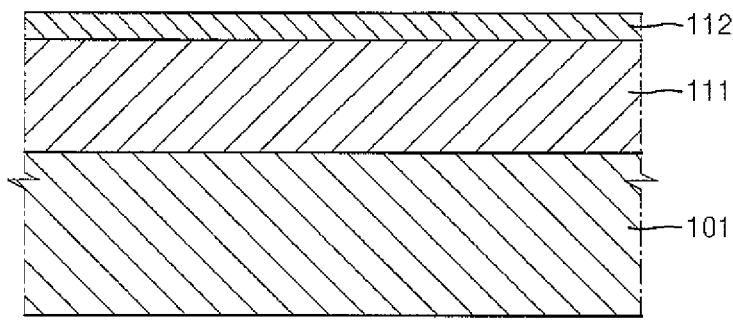
FIGS. 1 to 9 are schematic cross-sectional views for describing a method of manufacturing an organic light emitting display apparatus, according to some embodiments.

Referring to FIG. 1, a first plastic film 111 and a first barrier layer 112 are sequentially formed on a first substrate 101.

The first substrate 101 may be a transparent substrate through which laser beams can penetrate in an ablation process that will be described later. In addition, the first substrate 101 may comprise any material that has sufficient mechanical strength to not deform when various devices or layers are formed thereon. Even though a glass substrate is discussed in certain embodiments, the present embodiments are not limited thereto. The first substrate 101 may also comprise various types of materials that have characteristics as described above.

The first plastic film 111 may comprise a plastic material that has a lower specific gravity than a conventional glass substrate, is hard to break, and can be applied to a curved surface. As the thickness of the first plastic film 111 decreases, a display apparatus using the first plastic film 111 is light and thin. However, the thickness of the first plastic film 111 may be ensured in such a way that the plastic substrate may support weights of layers and devices formed on the first plastic film 111. The first plastic film 111 may have a thickness from about 10 to about 100 μm. If the first substrate 101 is ablated from the first plastic film 111 having a thickness of less than about 10 μm, the shapes of layers and devices which are formed on the first plastic film 111 may not be stably maintained. On the other hand, the first plastic film 111 having a thickness of more than about 100 μm may not be suitable for the thin film organic, light emitting diode according to the present embodiments.

The first plastic film 111 may comprise, for example; polyimide or polycarbonate. Polyimide has excellent mechanical strength, and an example of a temperature to process polyimide is about 450° C., and thus the thermal resistance of polyimide is better than that of different polymer materials. Even if a predetermined heating operation proceeds in order to form a thin-film transistor (TFT) and an organic light emitting diode on the polyimide substrate, the first plastic film 111 formed of polyimide may stably function as a flexible display substrate and support the weights of the TFT and devices.

The first barrier layer 112 is formed on the first plastic film 111. The first barrier layer 112 may comprise an inorganic material such as $SiO_x$, $SiN_x$, SiON, AlO, and AlON, or an organic material such as acryl or polyimide, where x is a natural number. Alternatively, organic materials and inorganic materials may be alternately stacked. The first barrier layer 112 blocks oxygen and moisture and facilitates crystallization of a semiconductor by preventing diffusion of moisture or impurities generated in the first plastic film 111 or adjusting a heat transmission rate when the semiconductor is crystallized.

Figure 2:
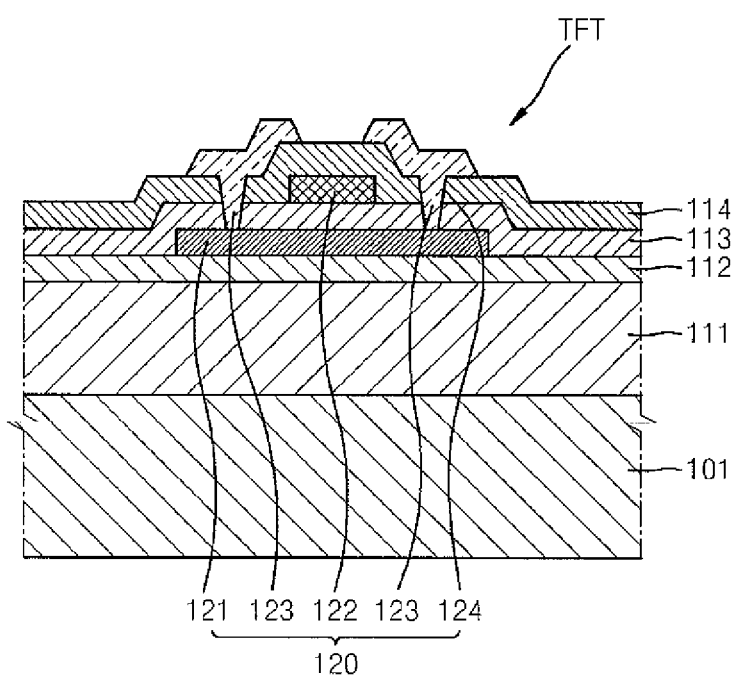

Then, a TFT is formed on the first barrier layer 112 as shown in FIG. 2. In FIG. 2, a top gate type TFT is illustrated. However, the TFT may be any type of TFT such as a bottom gate type TFT. Hereinafter, the TFT having the structure as shown in FIG. 2 will be described.

Referring to FIG. 2, in the top gate type TFT, a semiconductor layer 121, a gate insulating layer 113, a gate electrode 122, an interlayer insulating layer 114, a contact hole 124, source and drain electrodes 123, and a protection layer 115 (FIG. 3) are sequentially formed on the first barrier layer 112.

The semiconductor layer 121 may comprise poly silicon. In some embodiments, a predetermined region of the semiconductor layer 121 may be doped with impurities. The semiconductor layer 121 may comprise amorphous silicon instead of poly silicon, and may also comprise various organic semiconductor materials such as pentacene.

When the semiconductor layer 121 is formed of poly silicon, amorphous silicon is formed and crystallized to be changed to polysilicon. In order to crystallize amorphous silicon, rapid thermal annealing (RTA), solid phase crystallization (SPC), excimer laser annealing (ELA), metal induced crystallization (MIC), metal induced lateral crystallization (MILC), or sequential lateral solidification (SLS), for example, may be used. In order to use the plastic film according to the present embodiment, a high temperature heating operation is not desirable. Conventionally, since a high temperature is maintained during activation of a semiconductor, a temperature of a substrate is increased up to from about 400° C. to about 500° C., and thus a plastic substrate may not be used. However, recently, when a semiconductor is crystallized using a low-temperature poly-silicon (LTPS) method, the semiconductor is activated by irradiating laser beams on the semiconductor for a relatively short period of time. Thus, a substrate is not exposed to a temperature of about 300° C. or more, and all operations can be performed under a temperature of about 300° C. or less. Accordingly, the TFT may comprise plastic, for example, polyimide.

The gate insulating layer 113 is formed between the semiconductor layer 121 and the gate electrode 122 in order to insulate the semiconductor layer 121 and the gate electrode 122 from each other. The gate insulating layer 113 may comprise an insulating material such as silicon oxide and silicon nitride. The gate insulating layer 113 may also comprise other insulating organic materials.

The gate electrode 122 may comprise various conductive materials. For example, the gate electrode 122 may comprise magnesium (Mg), aluminum (Al), nickel (Ni), chromium (Cr), molybdenum (Mo), tungsten (W), MoW, or gold (Au). In this regard, the gate electrode 122 may have various structures such as a single-layered structure and a multi-layered structure.

The interlayer insulating layer 114 may comprise an insulating material such as silicon oxide and silicon nitride. The interlayer insulating layer 114 may also comprise other insulating organic materials. The contact hole 124 for exposing source and drain regions therethrough may be formed by selectively removing the interlayer insulating layer 114 and the gate insulating layer 113. The source and drain electrodes 123 having a single-layered structure or a multi-layered structure may comprise the same material used to form the gate electrode 122 and disposed on the interlayer insulating layer 114 so as to fill the contact hole 124.

The protection layer 115 (passivation layer and/or planarization layer (FIG. 3)) is formed on the source and drain electrodes 123 to protect and planarize the TFT disposed under the protection layer 115. The protection layer 115 may be configured to have various shapes, and may comprise an organic material such as benzocyclobutene (BCB) or acryl, or an inorganic material such as $SiN_x$. The protection layer 115 may have various structures such as a single-layered structure or a multi-layered structure.

A display device is formed on the TFT. Even though an organic light emitting diode (OLED) is used herein as the display device, the present embodiments are not limited thereto, and various display devices may also be used.

Figure 3:
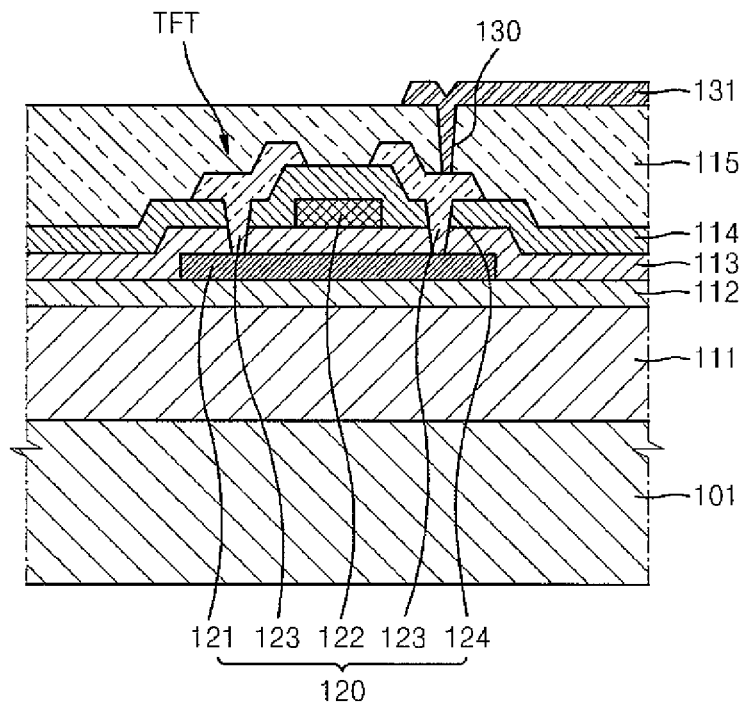

In order to form the OLED on the TFT, a first electrode 131 is electrically connected to one of the source and drain electrodes 123 via a contact hole 130, as shown in FIG. 3.

The first electrode 131 may function as one of the electrodes of the OLED and may comprise various conductive materials. The first electrode 131 may be a transparent electrode or a reflective electrode according to the OLED to be formed. If a transparent electrode is used, the first electrode 131 may comprise ITO, IZO, ZnO, or $In_2O_3$. Otherwise, if a reflective electrode is used, the first electrode 131 may be formed by forming a reflective layer using silver (Ag), magnesium (Mg), aluminum (Al), platinum (Pt), lead (Pd), gold (Au), nickel (Ni), neodymium (Nd), iridium (Ir), chromium (Cr), or any compound thereof, and doping the reflective layer with ITO, IZO, ZnO, or $In_2O_3$.

Figure 4:
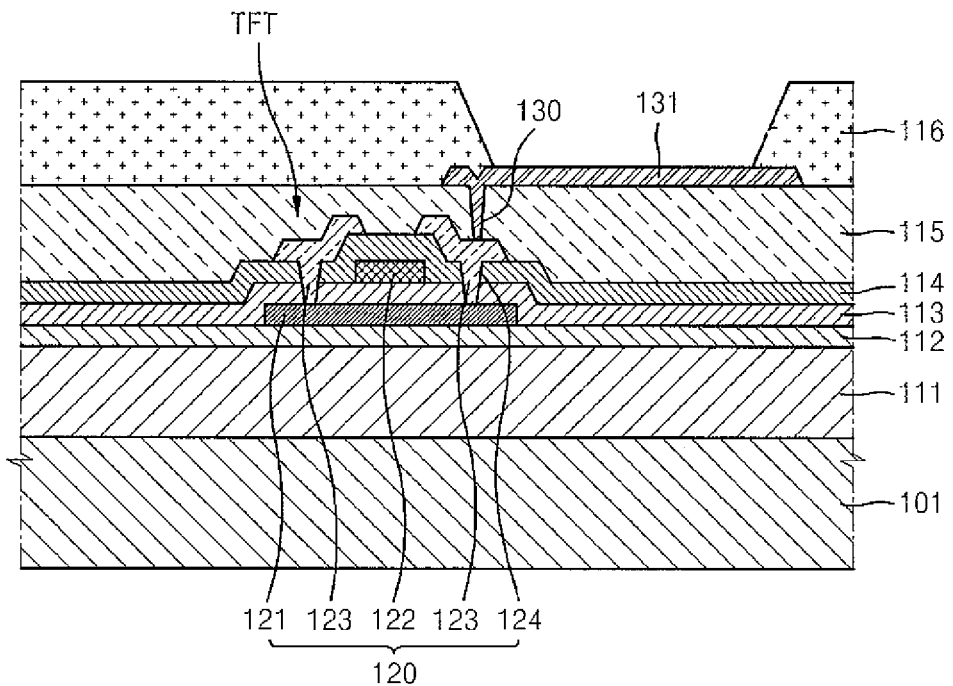
Figure 5:
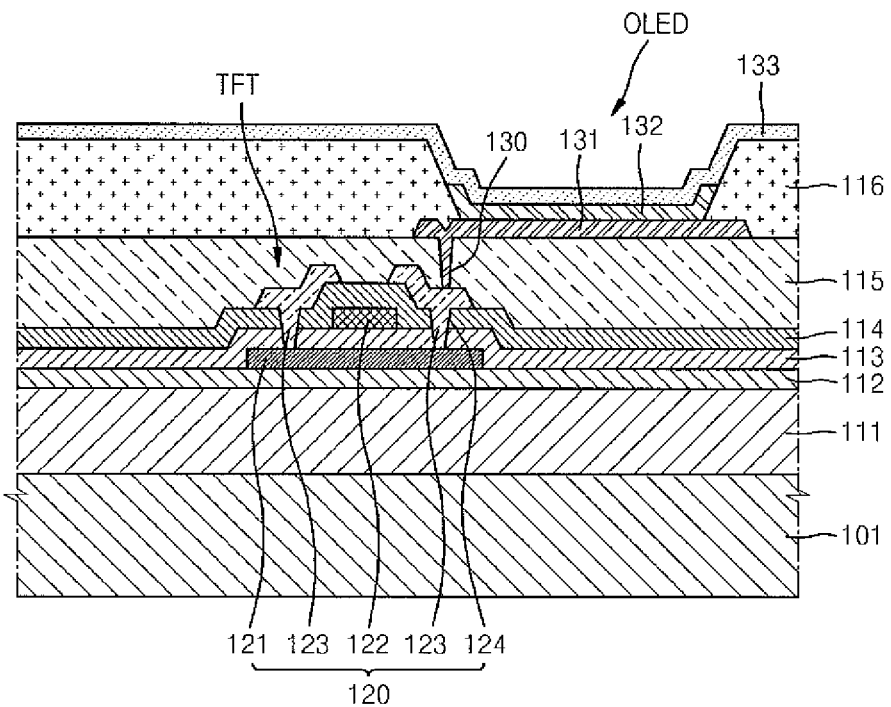

The OLED is prepared by forming a pixel definition layer 116 on the first electrode 131 using an insulating material such that at least one portion of the first electrode 131 is exposed, as shown in FIG. 4, forming an intermediate layer 132 that includes an emission layer on the exposed region of the first electrode 131, and forming a second electrode 133 that faces the first electrode 131 such that the first electrode 131 and the second electrode 133 are formed on both sides of the intermediate layer 132, as shown in FIG. 5.

Even though the intermediate layer 132 is disposed to correspond to each sub-pixel, i.e., the patterned first electrode 131 referring to FIG. 5, FIG. 5 is designed for convenience of description of the constituion of the sub-pixels. The intermediate layer may also be integrally formed with the intermediate layer 132 of an adjacent sub-pixel. In addition, some layers of the intermediate layer 132 may be formed to correspond to each sub-pixel, and the other layers of the intermediate layer 132 may be integrally formed with an intermediate layer 132 of adjacent sub-lixel.

The intermediate layer 132 may comprise a low molecular or high molecular weight organic material. If the intermediate layer 132 is formed of a low molecular weight organic material, a hole injection layer (HIL), a hole transport layer (HTL), an emission layer (EML), an electron transport layer (ETL), an electron injection layer (EIL), etc., may be stacked in a single or complex structure to form the intermediate layer 132. The low molecular weight organic material may be copper phthalocyanine (CuPc), N,N'-Di(naphthalene-1-yl)-N,N'-diphenylbenzidine (NPB), tris-8-hydroxyquinoline aluminum (Alq3), or the like. The intermediate layer 132 may be formed by vacuum depositing the low molecular weight organic material using masks.

If the intermediate layer 132 is formed of a high molecular weight organic material, the intermediate layer 132 may include a HTL and an EML. The HTL may comprise PEDOT, and the EML may comprise a high molecular weight organic material such as polyphenylenevinylene (PPV), polyfluorene, or the like. The intermediate layer 132 may be formed using a screen printing method, an ink jet printing method, or the like.

The second electrode 133 may also be a transparent or reflective electrode, as the first electrode 131. If a transparent electrode is used, the second electrode 133 may be formed by forming a layer including Li, Ca, LiF/Ca, LiF/Al, Al, Mg, or any combinations thereof, and then forming an auxiliary electrode or bus electrode line by using a conductive material such as ITO, IZO, ZnO, or $In_2O_3$. Otherwise, if a reflective electrode is used, the second electrode 133 may be formed by depositing Li, Ca, LiF/Ca, LiF/Al, Al, Ag, Mg, or combinations thereof on the whole surface of the intermediate layer 132 and pixel definition layer 116.

Figure 6:
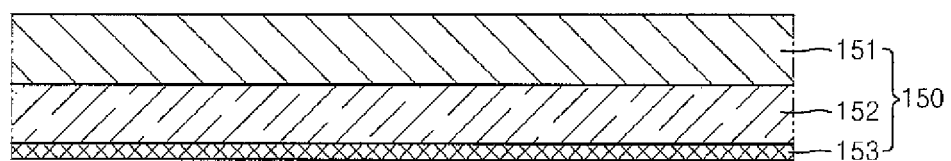

An encapsulation member 150 is separately prepared, as shown in FIG. 6.

Specifically, according to the method of manufacturing the flexible display apparatus according to the present embodiment, the encapsulation member 150 is separately prepared and combined with the upper portion of the OLED, and then a second substrate 151 of the encapsulation member 150 is ablated.

A thin film encapsulation is used to encapsulate the OLED in a process of manufacturing a conventional flexible display apparatus. According to the thin film encapsulation, after the OLED is prepared, an inorganic layer is deposited thereon to encapsulate the OLED. However, since this thin film encapsulation is directly performed on the OLED as a final process for preparing the OLED, the temperature for the process is not to greater than about 80° C. to prevent deterioration of the OLED, and deterioration of the OLED due to plasma during the deposition of the inorganic layer needs to be prevented.

According to the method of manufacturing the flexible display apparatus according to the present embodiment, an encapsulation member including a substrate, a plastic film, and a barrier layer is separately formed, and the substrate is ablated after the encapsulation member is combined with the OLED. Thus, the encapsulation process may be easily performed.

In this regard, the encapsulation member 150 of the flexible display apparatus may be formed by sequentially forming a second plastic film 152 and a second barrier layer 153 on the second substrate 151. This will now be described in more detail below.

The second substrate 151 may also comprise glass. The second plastic film 152 may comprise a plastic material that has lower specific gravity than a conventional glass substrate, is hard to break, and sufficiently flexible to be applied to a curved surface, as the first plastic film 111. Here, the thickness of the second plastic film 152 may be from about 10 μm to about 100 μm. In this regard, the second plastic film 152 may comprise polyimide or polycarbonate.

The second barrier layer 153 may comprise an inorganic material such as $SiO_x$, $SiN_x$, SiON, AlO, and AlON, or an organic material such as acryl or polyimide. Alternatively, organic materials and inorganic materials may be alternately stacked. The second barrier layer 153 blocks oxygen and moisture, prevents diffusion of moisture or impurities into the second plastic film 152, or facilitates crystallization of a semiconductor by adjusting a heat transmission rate when the semiconductor is crystallized.

The second barrier layer 153 may be formed by high-temperature deposition performed at a temperature of from about 80° C. to about 400° C. By separately preparing the encapsulation member 150 and combining the encapsulation member 150 with the OLED, as described above, the encapsulation member 150 may include the second barrier layer 153 that is formed by high-temperature deposition. In addition, since the encapsulation member 150 includes the second barrier layer 153, the OLED may be more stably protected.

Figure 7:
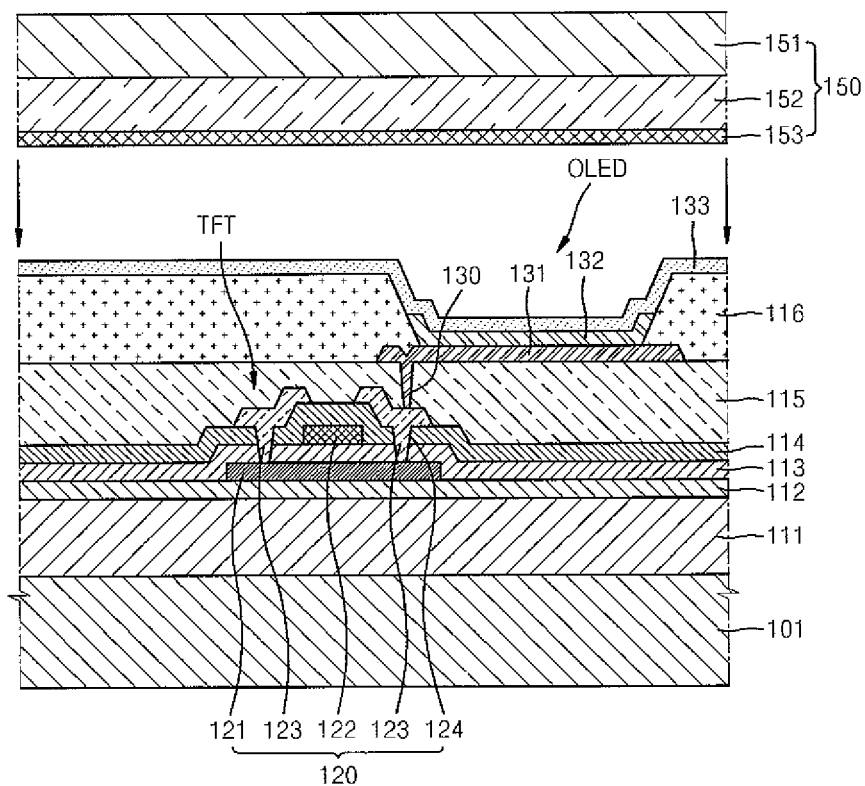
Figure 8:
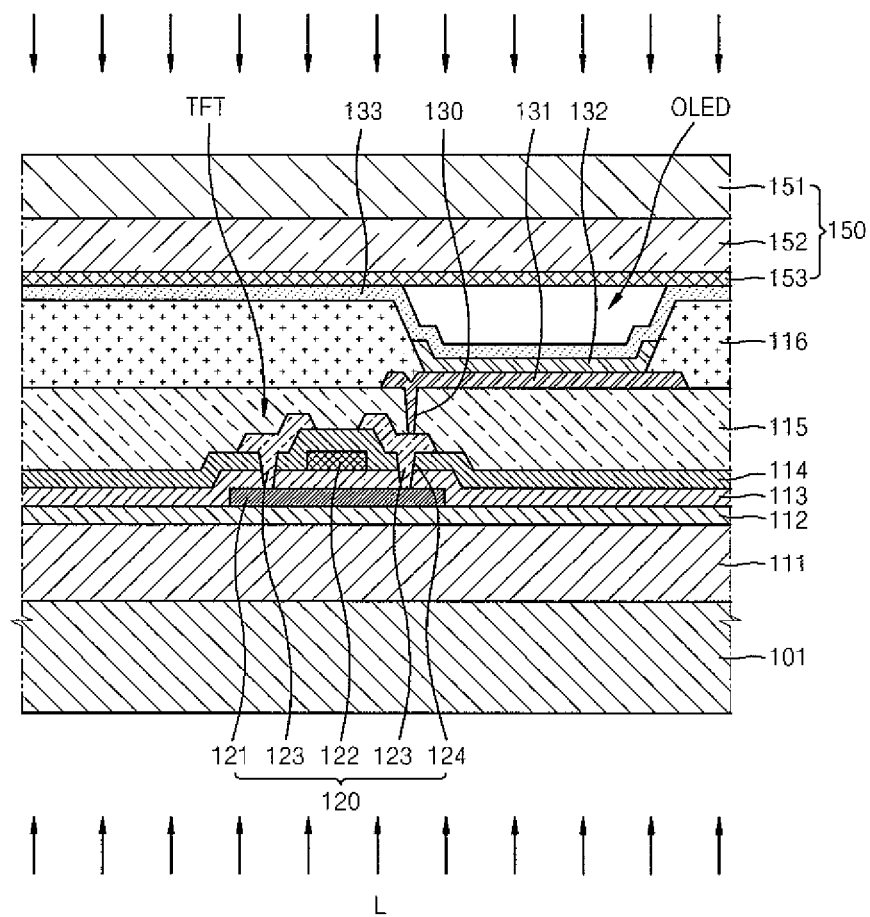

The encapsulation member 150 is disposed on the OLED and attached to the OLED, as shown in FIG. 7. In order to attach the encapsulation member 150 to the OLED, the first substrate 101 and the second substrate 151 may be ablated using laser beams L (FIG. 8). Since the second barrier layer 153 is formed of a photocurable material, the second barrier layer 153 may be cured while the first substrate 101 and the second substrate 151 are ablated by irradiating laser beams L (FIG. 8) to the first substrate 101 and the second substrate 151 after disposing the encapsulation member 150 on the OLED. The encapsulation member 150 is attached to the OLED, while the first substrate 101 and the second substrate 151 are ablated. The encapsulation member 150 may also be attached to the OLED using viscous material contained in the second barrier layer 153. The encapsulation member 150 may be attached to the OLED by disposing the encapsulation member 150 on the OLED, and pressing the encapsulation member 150 and the OLED.

Figure 9:
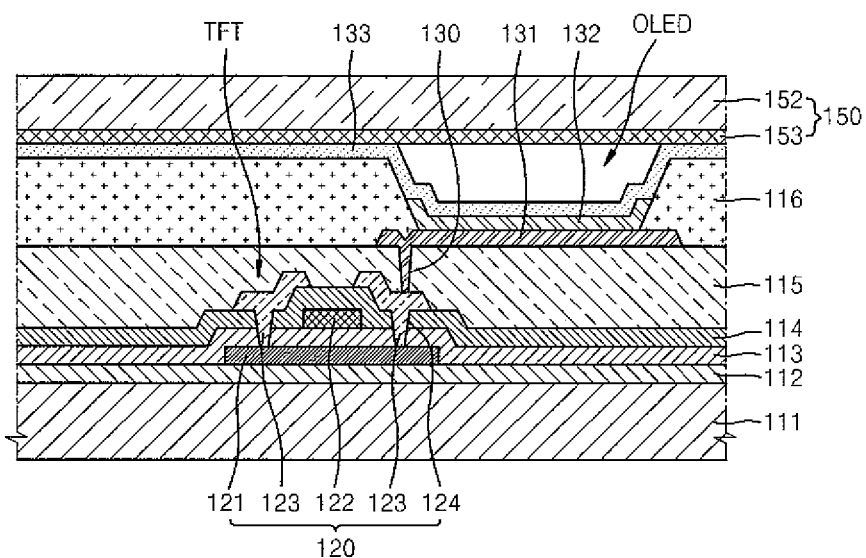

The first substrate 101 and the second substrate 151 are ablated by irradiating laser beams L thereto, as shown in FIG. 8, to obtain a flexible display apparatus including the TFT and the OLED on the first plastic film 111, as shown in FIG. 9. To ablate the first substrate 101 and the second substrate 151, laser beams L such as XeCl, KrF, and ArF which are formed by combining AF, Kr, and Xe, as coherent light having a wavelength of from about 100 nm to about 350 nm, with a gas such as $F_2$, or HCl, as halogen gas may be used.

Since there is no need to directly encapsulate the OLED according to the present embodiment, deterioration of the OLED due to plasma while depositing the inorganic layer may be reduced. In addition, an inorganic layer may be formed on a plastic film that is resistant to high temperatures. Furthermore, since the plastic film is exposed after the substrate is ablated, a separate protective film is not required. Furthermore, according to the method of manufacturing the flexible display apparatus according to the present embodiment, a thin and light OLED having excellent mechanical strength and that is flexible to be applied to a curved surface may be manufactured.

Figure 10:
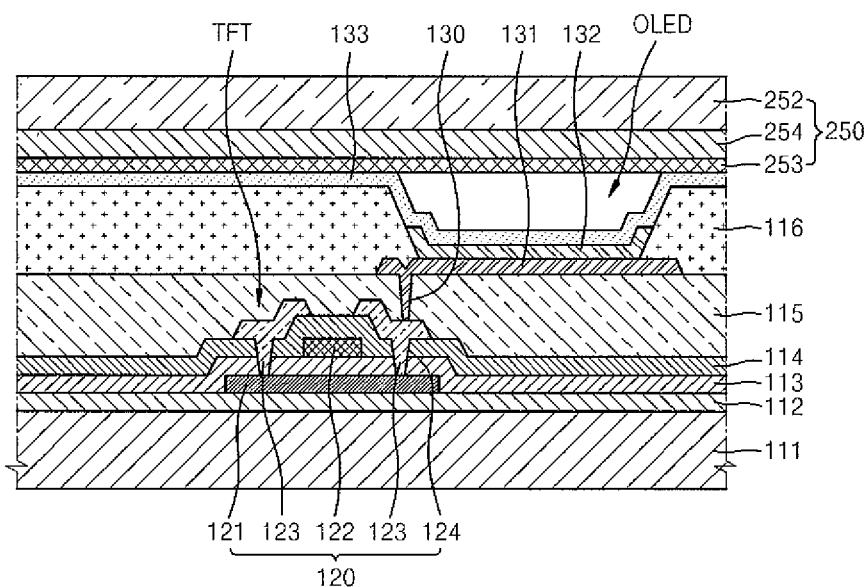
FIG. 10 is a schematic cross-sectional view of a flexible display apparatus according to another embodiment.

FIG. 10 is a schematic cross-sectional view of a flexible display apparatus according to another embodiment. Referring to FIG. 10, the flexible display apparatus according to the present embodiment includes a first barrier layer 112 formed on a first plastic film 111, a TFT formed on the first barrier layer 112, an OLED formed on the TFT, and an encapsulation member 250 including a second barrier layer 253, a hydrophobic layer 254, and a second plastic film 252.

Here, the hydrophobic layer 254 is disposed between the second barrier layer 253 and the second plastic film 252. Hereinafter, the flexible display apparatus will be described in more detail.

As described above, a thin film encapsulation is generally used to encapsulate the OLED in a process of manufacturing a conventional flexible display apparatus. According to the thin film encapsulation, after the OLED is prepared, an inorganic layer is deposited thereon to encapsulate the OLED. Thus, a hydrophobic layer cannot be directly wet-coated on the OLED. If the hydrophobic layer is directly formed on the OLED, moisture that is generated during the preparation of the OLED cannot be emitted, and the OLED may deteriorate while the wet-coated hydrophobic layer is cured.

However, since the encapsulation member 250 is separately prepared and combined with the OLED in the flexible display apparatus manufactured according to the present embodiment, the hydrophobic layer 254 may be formed between the second barrier layer 253 and the second plastic film 252 using wet coating.

The second plastic film 252 is formed on a second substrate 251 and the second barrier layer 253 is formed thereon using wet coating, which was not possible in a conventional thin film encapsulation to prepare the encapsulation member 250.

The hydrophobic layer 254 may comprise a material such as $TiO_2$, BaO, and CaO and may have a thickness of from about 1 nm to about 1 μm. In some embodiments, hydrophobic layer 254 may have a thickness of from about 500 nm to about 1 μm.

As described above, the OLED may be efficiently protected from oxygen, moisture, etc. by forming the hydrophobic layer 254 between the second barrier layer 253 and the second plastic film 252. Furthermore, the OLED may be efficiently manufactured with a high yield by forming the hydrophobic layer 254 using wet coating.

According to the method of manufacturing the flexible display apparatus according to the present embodiments, the encapsulation process may be efficiently performed.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A method of manufacturing a flexible display apparatus, the method comprising:
   sequentially forming a first plastic film and a first barrier layer on a first substrate;
   forming a thin-film transistor on the first barrier layer;
   forming a first electrode on the thin-film transistor, the first electrode being electrically connected to the thin-film transistor, forming an intermediate layer on the first electrode, and forming a second electrode on the intermediate layer;
   separately forming an encapsulation member comprising a second substrate, a second plastic film, and a second barrier layer, wherein the second plastic film and the second barrier layer are sequentially stacked on the second substrate;
   combining the encapsulation member with the upper portion of the second electrode so that the second barrier layer faces the second electrode;
   ablating the first substrate from the first plastic film; and
   ablating the second substrate from the second plastic film.

2. The method of claim 1, wherein the forming the encapsulation member comprises forming the second barrier layer using deposition at a temperature of less than about 400° C.

3. The method of claim 1, wherein the forming the encapsulation member comprises forming the second barrier layer using deposition at a temperature larger than 80° C. and less than about 400° C.

4. The method of claim 1, wherein the first barrier layer and second barrier layer each comprises an organic layer, an inorganic layer, or multiple layers of organic layers and inorganic layers that are alternately stacked.

5. The method of claim 1, wherein the second barrier layer comprises a photocurable material, and wherein the encapsulation member is combined with the upper portion of the second electrode while the photocurable material is photocured.

6. The method of claim 1, wherein the second barrier layer comprises a viscous material, and wherein the encapsulation member is combined with the upper portion of the second electrode using the second barrier layer.

7. The method of claim 1, wherein the ablating the first substrate from the first plastic film and ablating the second substrate from the second plastic film are performed by irradiating laser beams to the first substrate and second substrate.

8. The method of claim 7, wherein the second barrier layer comprises a photocurable material that is photocured by the laser beams.

9. The method of claim 1, wherein the first plastic film and second plastic film comprise at least one selected from the group consisting of polyimide and polycarbonate.

10. The method of claim 1, wherein the encapsulation member further comprises a hydrophobic layer.

11. The method of claim 10, wherein the hydrophobic layer is formed between the second plastic film and the second barrier layer.

12. The method of claim 10, wherein the hydrophobic layer is formed by wet coating.

13. The method of claim 10, wherein the hydrophobic layer comprises at least one selected from the group consisting of $TiO_2$, BaO, and CaO.

14. The method of claim 1, wherein the flexible display appartus comprises an organic light emitting diode (OLED).

15. A flexible display apparatus prepared by the method of claim 1.

16. A flexible display apparatus prepared by a method of:
sequentially forming a first plastic film and a first barrier layer on a first substrate;
forming a thin-film transistor on the first barrier layer;
forming a protection layer on the thin-film transistor;
forming a first electrode on the thin-film transistor the first electrode being electrically connected to the thin-film transistor, forming an intermediate layer on the first electrode, and forming a second electrode on the intermediate layer;
separately forming an encapsulation member comprising a second substrate, a second plastic film, and a second barrier layer, wherein the second plastic film and the second barrier layer are sequentially stacked on the second substrate;
combining the encapsulation member with the upper portion of the second electrode so that the second barrier layer faces the second electrode;
ablating the first substrate from the first plastic film; and
ablating the second substrate from the second plastic film.

* * * * *